(12) United States Patent
Wang et al.

(10) Patent No.: US 11,632,869 B2
(45) Date of Patent: Apr. 18, 2023

(54) DETACHABLY FIXING DEVICE AND ELECTRONIC APPARATUS CASING THEREWITH

(71) Applicant: Wistron Corporation, New Taipei (TW)

(72) Inventors: Jun Hao Wang, New Taipei (TW); Zhaoping Fu, New Taipei (TW); Li Ke, New Taipei (TW)

(73) Assignee: Wistron Corporation, New Taipei (TW)

( * ) Notice: Subject to any disclaimer, the term of this patent is extended or adjusted under 35 U.S.C. 154(b) by 149 days.

(21) Appl. No.: 17/004,021

(22) Filed: Aug. 27, 2020

(65) Prior Publication Data

US 2022/0007534 A1 Jan. 6, 2022

(30) Foreign Application Priority Data

Jul. 6, 2020 (CN) .......................... 202010639633.2

(51) Int. Cl.
*H05K 7/14* (2006.01)
*F16C 29/02* (2006.01)
*H05K 5/02* (2006.01)

(52) U.S. Cl.
CPC ........... *H05K 7/1418* (2013.01); *F16C 29/02* (2013.01); *H05K 5/0217* (2013.01)

(58) Field of Classification Search
CPC .......... H05K 7/1418; F16C 29/02; F16B 1/02
USPC ..................................................... 312/223.2
See application file for complete search history.

(56) References Cited

U.S. PATENT DOCUMENTS

| | | | | | |
|---|---|---|---|---|---|
| 5,967,824 | A | * | 10/1999 | Neal ....................... | G06F 1/186 439/157 |
| 7,364,447 | B1 | * | 4/2008 | Desrosiers .............. | G06F 1/186 439/372 |
| 8,690,267 | B2 | * | 4/2014 | Jiang ...................... | G06F 1/187 361/679.33 |
| 8,737,084 | B2 | * | 5/2014 | Liu ...................... | H05K 7/1417 361/740 |

(Continued)

FOREIGN PATENT DOCUMENTS

| CN | 101377701 A | 3/2009 |
|---|---|---|
| TW | M311126 | 5/2007 |

(Continued)

*Primary Examiner* — James O Hansen
(74) *Attorney, Agent, or Firm* — Winston Hsu

(57) ABSTRACT

A detachably fixing device includes a base, a circuit board carrying plate, and a sliding plate. The circuit board carrying plate is slidably disposed on the base in a first direction and has a carrying plate linkage portion. The sliding plate is slidably disposed on the base in a second direction. The first direction and the second direction are non-parallel. The sliding plate has a sliding plate linkage portion mechanically connected with the carrying plate linkage portion, and an engaging portion. The circuit board carrying plate is operable to move to make the sliding plate slide outward relative to the base to make the engaging portion protrude from the base. An electronic apparatus casing includes a casing frame and the detachably fixing device. The detachably fixing device is detachably disposed on the casing frame. The engaging portion is separably engaged with an engaging structure of the casing frame.

20 Claims, 11 Drawing Sheets

(56) References Cited

U.S. PATENT DOCUMENTS 9,541,968 B2 * 1/2017 Chen .................... H05K 5/0221
2014/0254086 A1 * 9/2014 Li ....................... H05K 7/1489
439/64

FOREIGN PATENT DOCUMENTS

TW 201414932 A 4/2014
TW 201803225 A 1/2018

* cited by examiner

DETACHABLY FIXING DEVICE AND ELECTRONIC APPARATUS CASING THEREWITH

BACKGROUND OF THE INVENTION

1. Field of the Invention

The present invention relates to an electronic apparatus casing, and more particularly to an electronic apparatus casing with a detachably fixing device.

2. Description of the Prior Art

Detachable circuit board modules generally used in electronic devices are usually installed by screws. In the installation of the circuit board module, a tool is required to screw the screws; in the replacement of the circuit board module, the tool is also required to loosen the screws. When the above operation occurs on the consumer side, using tools to detach the circuit board module will increase the inconvenience of consumers. Furthermore, the number of screws and hole positions required for circuit board modules of different specifications may be different, which will also increase the inconvenience of the above installation and removal operations.

SUMMARY OF THE INVENTION

An objective of the invention is to provide a detachably fixing device, on which a circuit board can be fixed. With the detachably fixing device, the circuit board can be installed in an electronic apparatus casing or removed from the electronic apparatus casing without tools.

A detachably fixing device of an embodiment according to the invention includes a base, a circuit board carrying plate, and a sliding plate. The circuit board carrying plate is slidably disposed on the base in a first direction and has a carrying plate linkage portion. The sliding plate is slidably disposed on the base in a second direction. The first direction and the second direction are non-parallel. The sliding plate has a sliding plate linkage portion and an engaging portion. The sliding plate linkage portion and the carrying plate linkage portion are mechanically connected with each other. The circuit board carrying plate is operable to slide to make the sliding plate slide outward relative to the base, so that the engaging portion protrudes from the base. Thereby, the detachably fixing device can fix a circuit board through the circuit board carrying plate and separably engage with an engaging structure of an electronic apparatus casing.

Another objective of the invention is to provide an electronic apparatus casing having a detachably fixing device, on which a circuit board can be fixed. The circuit board is installed in or detached from the electronic apparatus casing through the detachably fixing device.

An electronic apparatus casing of an embodiment according to the invention includes a casing frame and a detachably fixing device. The casing frame has an engaging structure. The detachably fixing device is detachably disposed on the casing frame and includes a base, a circuit board carrying plate, and a sliding plate. The circuit board carrying plate is slidably disposed on the base in the first direction and has a carrying plate linkage portion. The sliding plate is slidably disposed on the base in a second direction. The first direction and the second direction are non-parallel. The sliding plate has a sliding plate linkage portion and an engaging portion. The sliding plate linkage portion and the carrying plate linkage portion are mechanically connected with each other. The circuit board carrying plate is operable to slide to make the sliding plate slide outward relative to the base, so that the engaging portion protrudes from the base to separably engage with an engaging structure. Thereby, the detachably fixing device can fix a circuit board through the circuit board carrying plate and separably engage with the engaging structure of the casing frame through the engaging portion.

Compared with the prior art, the detachably fixing device and the electronic apparatus casing according to the invention, a user can use the detachably fixing device to easily install the circuit board fixed thereon into the electronic apparatus casing or remove the circuit board from the electronic apparatus casing without tools, which solves the inconvenience in the prior art that users need to use tools to screw or remove screws when detaching the circuit board modules.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
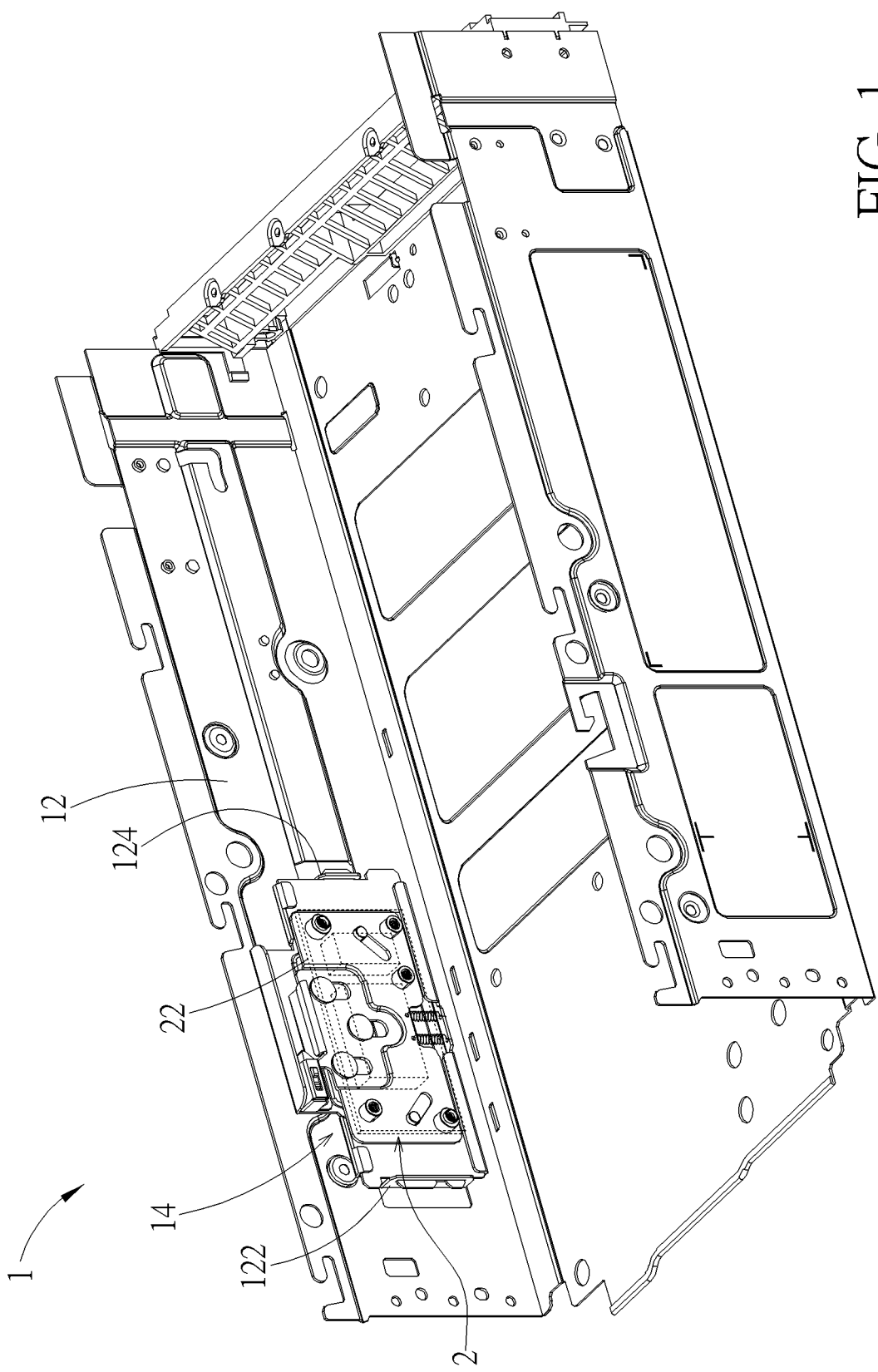
FIG. 1 is a schematic diagram illustrating an electronic apparatus casing according to an embodiment.
Figure 2:
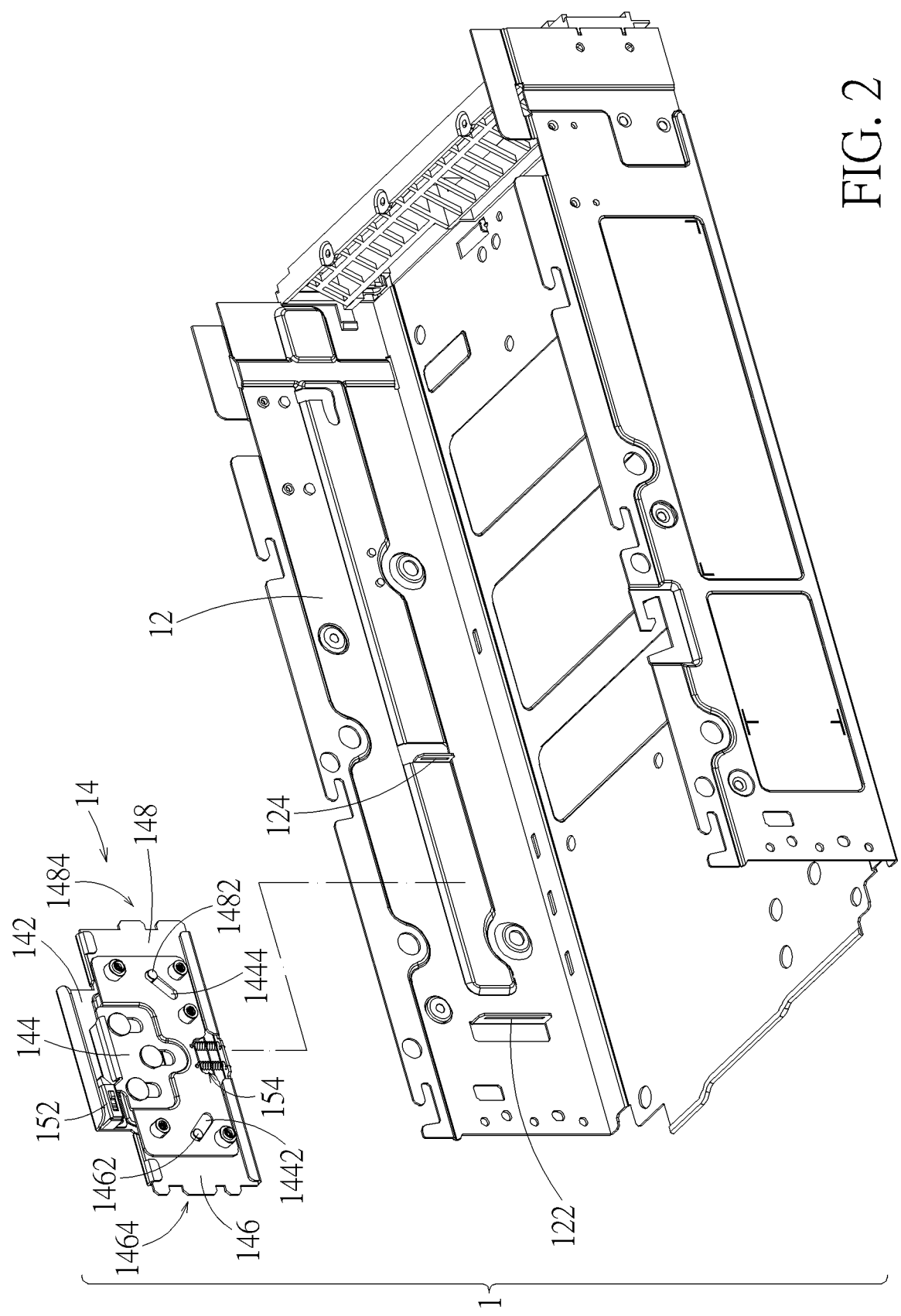
FIG. 2 is a partially exploded view of the electronic apparatus casing in FIG. 1.

Please refer to FIG. 1 and FIG. 2. An electronic apparatus casing 1 according to an embodiment includes a casing frame 12 and a detachably fixing device 14. The detachably fixing device 14 is detachably disposed on the casing frame 12. In practice, the electronic apparatus casing 1 also includes other components, such as a top cover, a rear cover and so on. For drawing simplification, the electronic apparatus casing 1 mainly shows parts related to the detachably fixing device 14. In the embodiment, the casing frame 12 has two engaging structures 122 and 124. The detachably fixing device 14 is operable to be separably engaged with the two engaging structures 122 and 124. In practice, the electronic apparatus casing 1 can be used as, but not limited to, the casing of a server. The detachably fixing device 14 can be used for fixing a circuit board module, such as, but not limited to, expansion cards, memory cards and so on.

Figure 3:
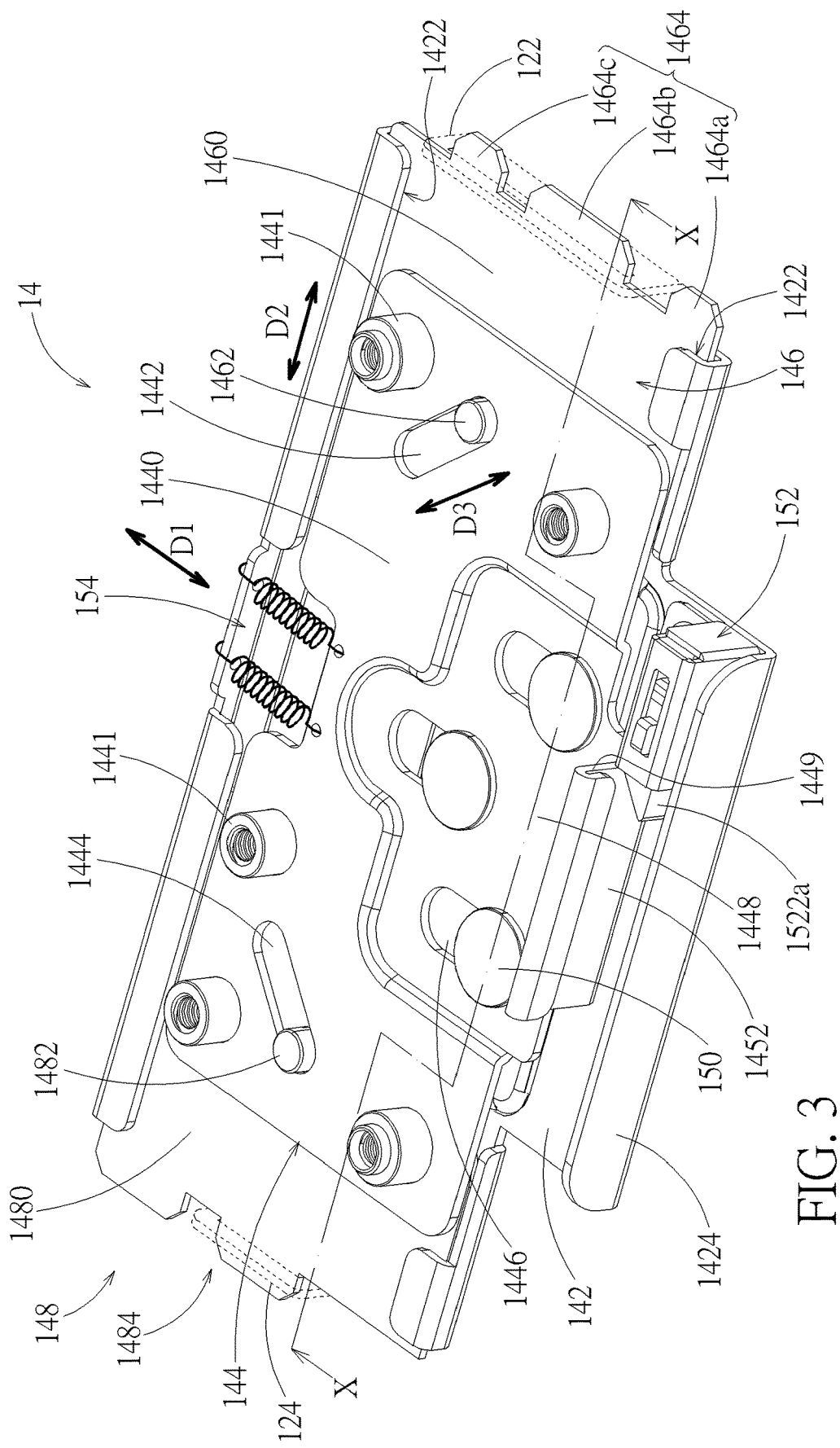
FIG. 3 is a schematic diagram illustrating a detachably fixing device in FIG. 1.
Figure 4:
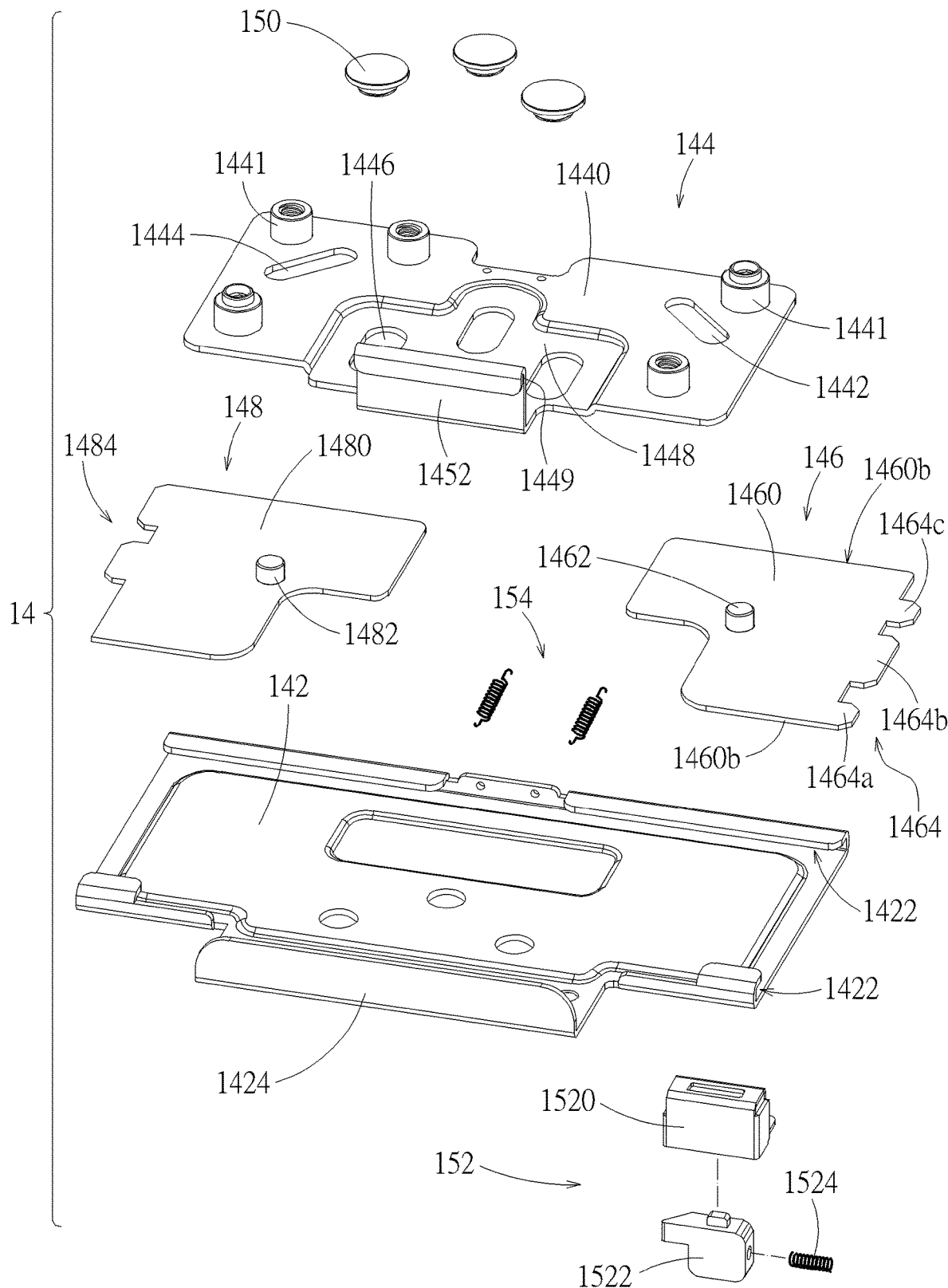
FIG. 4 is an exploded view of the detachably fixing device in FIG. 3.

Please refer to FIG. 3 and FIG. 4. The detachably fixing device 14 includes a base 142, a circuit board carrying plate 144, a first sliding plate 146, and a second sliding plate 148. The circuit board carrying plate 144 is slidably disposed on the base 142 in a first direction D1 (indicated by a double-headed arrow in the figures) and has a plate body 1440, and a first carrying plate linkage portion 1442 and a second carrying plate linkage portion 1444 which are oppositely disposed on the plate body 1440. A plurality of supporting posts 1441 (e.g. but not limited to posts with a threaded hole) are disposed on the plate body 1440. The plate body 1440 can fix a circuit board 22 (e.g. a circuit board module 2 which includes the circuit board 22 and the required electronic components installed on the circuit board 22, such as a controller, a processor, a memory, a connector and so on; for facilitating the reading of figures, the circuit board module 2 is represented by a simple square, of which the profile is shown in dashed lines in FIG. 1) through the supporting posts 1441. In practice, circuit boards of different specifications can be fixed and supported by different combinations of supporting posts 1441. The first sliding plate 146 is slidably disposed on the base 142 in a second direction D2 (indicated by a double-headed arrow in the figures). The first direction D1 and the second direction D2 are non-parallel. The first sliding plate 146 has a plate body 1460, and a first sliding plate linkage portion 1462 and a first engaging portion 1464 which are disposed on the plate body 1460. The first sliding plate linkage portion 1462 and the first carrying plate linkage portion 1442 are mechanically connected with each other. The second sliding plate 148 is slidably disposed on the base 142 in the second direction D2. The second sliding plate 148 has a plate body 1480, and a second sliding plate linkage portion 1482 and a second engaging portion 1484 which are disposed on the plate body 1480. The second sliding plate linkage portion 1482 and the second carrying plate linkage portion 1444 are mechanically connected with each other.

In the embodiment, the first carrying plate linkage portion 1442 is a guiding slot. The first sliding plate linkage portion 1462 is a guiding post. The guiding post is slidably disposed in the guiding slot. The guiding slot has an extension direction D3 (indicated by a double-headed arrow in the figures) which is non-parallel to the first direction D1 and the second direction D2. Thereby, when sliding relative to the base 142 in the first direction D1, the circuit board carrying plate 144 can drive the first sliding plate 146 to slide relative to the base 142 in the second direction D2. The ratio of the sliding amounts of the circuit board carrying plate 144 and the first sliding plate linkage portion 1462 can be determined by the angle relationship between the extension direction D3, the first direction D1, and the second direction D2, which will not be described in addition. In the embodiment, the first direction D1 is perpendicular to the second direction D2, and included angles of the extension direction D3 with the first direction D1 and the second direction D2 are equal; however, it is not limited thereto in practice. In addition, in practice, the first carrying plate linkage portion 1442 can be realized by a guiding post, and correspondingly the first carrying plate linkage portion 1442 can be realized by a guiding slot. Therein, the guiding post is slidably disposed in the guiding slot. This structural configuration also can realize the above linkage relationship between the circuit board carrying plate 144 and the first sliding plate 146, which will not be described in addition.

Furthermore, in the embodiment, the second sliding plate 148 and the first sliding plate 146 are substantially symmetrical in structure. The foregoing descriptions about the first carrying plate linkage portion 1442 and the first sliding plate linkage portion 1462 and their variants are also applicable to the second carrying plate linkage portion 1444 and the second sliding plate linkage portion 1482, which will not be repeated in addition. However, in practice, the linkage relationship between the circuit board carrying plate 144 and the second sliding plate 148 is not limited to the same as the linkage relationship between the circuit board carrying plate 144 and the first sliding plate 146. Furthermore, the first sliding plate 146 and the second sliding plate 148 are not limited to sliding relative to the base 142 in parallel to each other. For example, an included angle of 120 degrees or 60 degrees is formed between the sliding direction of the second sliding plate 146 relative to the base 142 and the first direction D1. The sliding direction of first sliding plate 146 relative to the base 142 (i.e. the second direction D2) and the first direction D1 still remain perpendicular to each other or form an included angle of other degrees.

Figure 5:
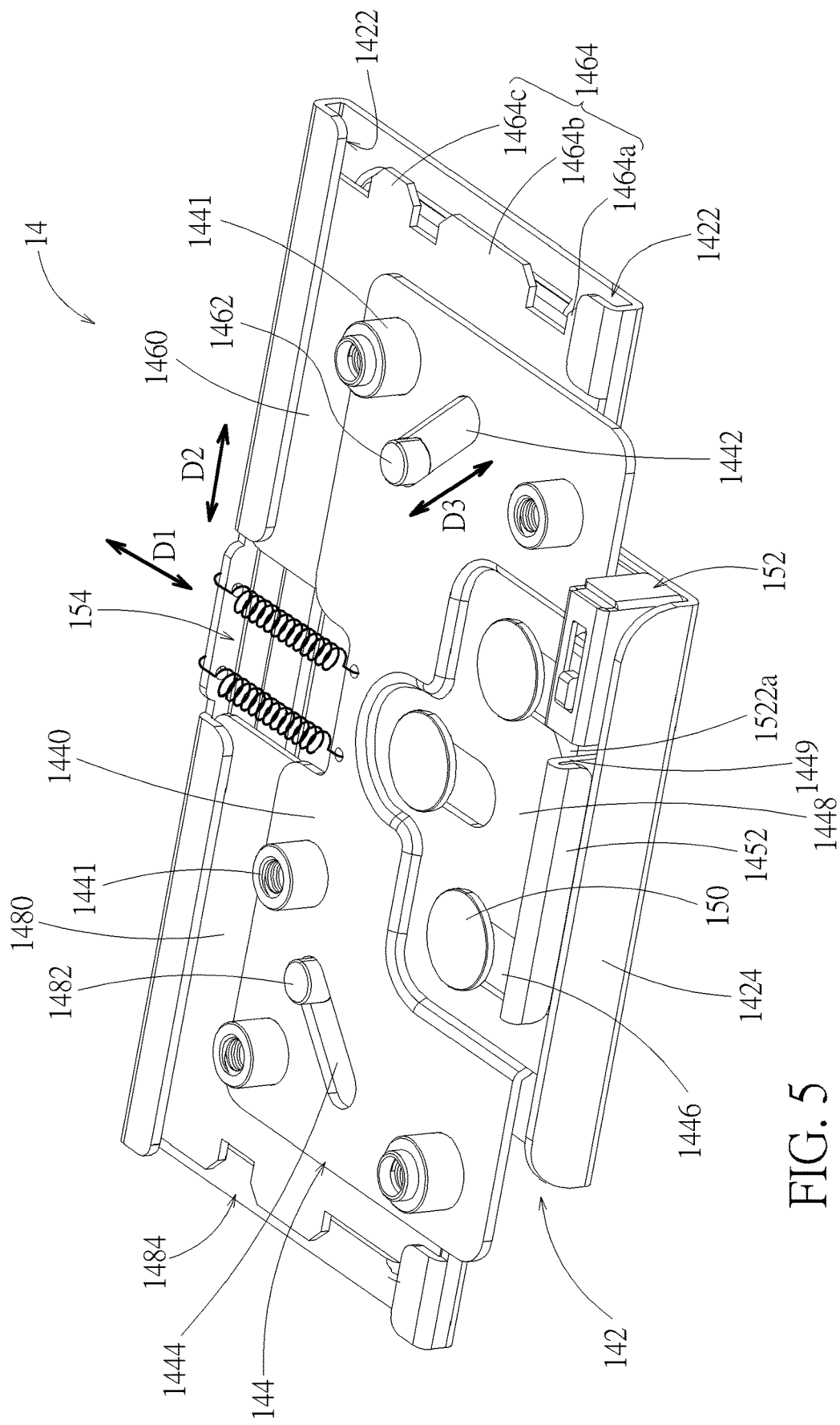
FIG. 5 is a schematic diagram illustrating the detachably fixing device in FIG. 3 when a circuit board carrying plate thereof is at a first position.

Please also refer to FIG. 5. By the linkage relationship between the circuit board carrying plate 144 and the first sliding plate 146 and the second sliding plate 148, the circuit board carrying plate 144 is operable to slide to drive the first sliding plate 146 and the second sliding plate 148 at the same time to slide outward or inward relative to the base 142, so that the first engaging portion 1464 and the second engaging portion 1484 protrude from the base 142 or retract back to the base 142 correspondingly. Therein, when the circuit board carrying plate 144 slides to a first position (as shown by FIG. 5), both the first engaging portion 1464 and the second engaging portion 1484 retract back to the base 142 to disengage from the engaging structures 122 and 124 of the casing frame 12, so that the detachably fixing device 14 can be detached from the casing frame 12. When the circuit board carrying plate 144 slides to a second position (as shown by FIG. 1 or FIG. 3), both the first engaging portion 1464 and the second engaging portion 1484 protrude from the base 142 to separately engage with the engaging structures 122 and 124 of the casing frame 12. Therein, in FIG. 3, the profiles of the engaging structures 122 and 124 are shown in dashed lines for indicating their relative locations when the first engaging portion 1464 and the second engaging portion 1484 are engaged with the engaging structures 122 and 124.

Furthermore, in the embodiment, the first engaging portion 1464 includes a plurality of tabs 1464a, 1464b and 1464c protruding in the second direction D2. The engaging structure 122 of the casing frame 12 corresponding to the first engaging portion 1464 includes a locking slot. After the detachably fixing device 14 is installed onto the casing frame 12 (i.e. the first engaging portion 1464 is engaged with the engaging structure 122), the tabs 1464b and 1464c fit in the locking slot, but the tab 1464a does not fit in the locking slot. In practice, based on an actual size of the locking slot, one or more of the tabs can fit in the locking slot (not limited to continuous tabs) to realize the separable engagement of the first engaging portion 1464 and the engaging structure 122. Therefore, the first engaging portion 1464 can adapt to engaging structures of different sizes (e.g. limited by the internal structural design of electronic apparatus 1) by use of the tabs 1464a, 1464b and 1464c, so as to increase the application range of the detachably fixing device 14. Furthermore, the above description about the first engaging portion 1464 is also applicable to the second engaging portion 1484, which will not be repeated in addition.

In addition, in the embodiment, the circuit board carrying plate 144 realizes the sliding arrangement in the first direction D1 through a plurality of guiding structures. Therein, one guiding structure is realized by a guiding slot 1446 and a corresponding guiding post 150. The guiding slot 1446 is formed through the plate body 1440. The guiding post 150 passes through the guiding slot 1446 and is connected to the base 142. The guiding slot 1446 extends in the first direction D1. The guiding post 150 restrictedly slides in guiding slot 1446. The plate body 1440 can be restricted to slide parallel to the first direction D1 through these guiding structures. Furthermore, in the embodiment, the guiding post 150 has a T-shaped axial section and therefore has a structural restraint effect on the plate body 1440 in the vertical direction (i.e. the direction perpendicular to the first direction D1 and second direction D2), which can prevent the plate body 1440 from separating from the base 142.

Figure 6:
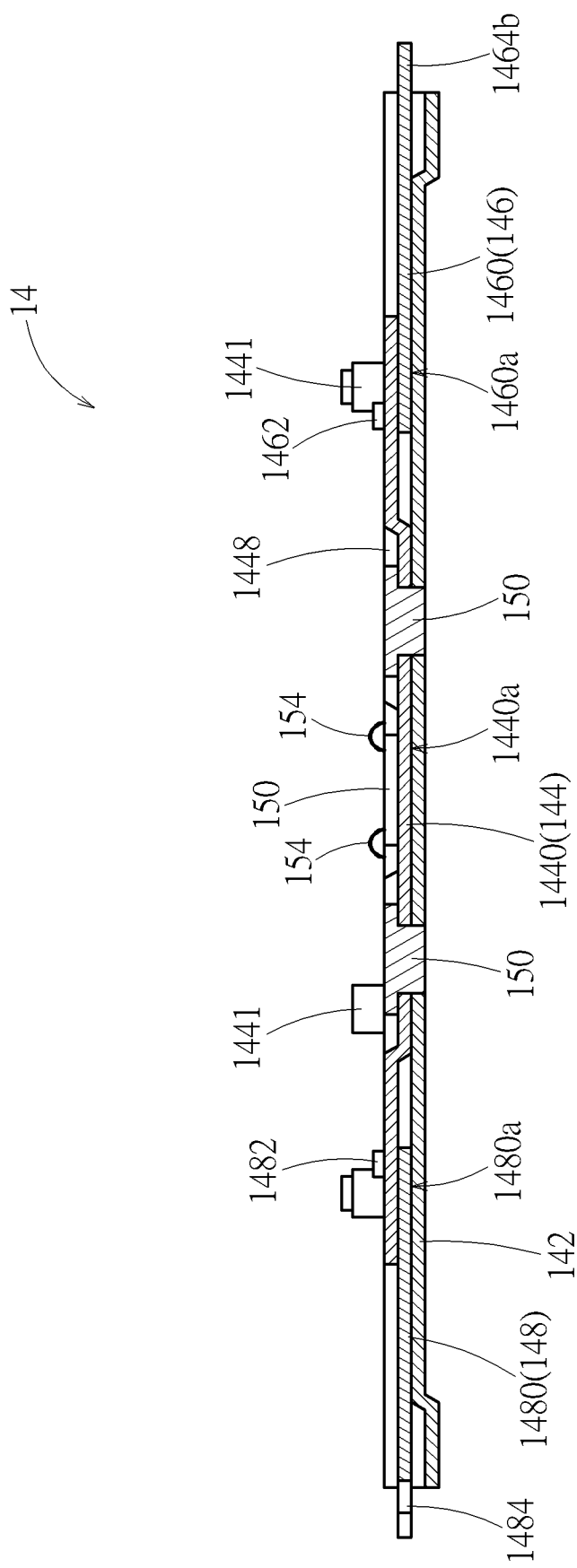
FIG. 6 is a sectional view of the detachably fixing device along the line X-X in FIG. 3.

In addition, please also refer to FIG. 6. In the embodiment, the plate body 1440 has a recess 1448. The guiding slot 1446 is formed on the recess 1448. At least most of the head of the guiding post 150 (i.e. the head of the T-shaped axial section) is accommodated in the recess 1448, which can avoid structural interference between the guiding post 150 and the circuit board module 2 (or the circuit board 22 thereof). Furthermore, in the embodiment, the first sliding plate 146 and the second sliding plate 148 are slidably disposed between the base 142 and the circuit board carrying plate 144, so that the circuit board carrying plate 144 has a structural restraint effect on the first sliding plate 146 and the second sliding plate 148 in the vertical direction (i.e. the direction perpendicular to the first direction D1 and second direction D2), which can prevent the first sliding plate 146 and the second sliding plate 148 from separating from the base 142. The depth of the recess 1448 is equivalent to the thickness of the first sliding plate 146 and the second sliding plate 148, so that the bottom surface 1440a of the plate body 1440 of the circuit board carrying plate 144 (i.e. the bottom surface corresponding to the recess 1448) is coplanar with the bottom surface 1460a of the plate body 1460 of the first sliding plate 146 and the bottom surface 1480a of the plate body 1480 of the second sliding plate 148. This structural configuration is conducive to reduction of the overall thickness of the detachably fixing device 14.

In addition, please refer to FIG. 3 and FIG. 4. In the embodiment, correspondingly to the first sliding plate 146, the base 142 has two sliding slots 1422 extending in the second direction D2. Two opposite edges 1460b of the plate body 1460 of the first sliding plate 146 slide in the two sliding slots 1422 respectively. This structural configuration realizes the sliding arrangement of the first sliding plate 146 on the base 142 in the second direction D2; however, it is not limited thereto in practice. For example, it is practicable to use a structure similar to the guiding structure for the sliding arrangement of the plate body 1440 of the circuit board carrying plate 144 on the base 142. Furthermore, in the embodiment, the sliding slots 1422 are formed by structures bending and extending from both sides of the base 142, and therefore has a structural restraint effect on the first sliding plate 146 in the vertical direction (i.e. the direction perpendicular to the first direction D1 and second direction D2), which can prevent the plate body 1460 of the first sliding plate 146 from separating from the base 142. Furthermore, the above description about the sliding engagement of the first sliding plate 146 and the base 142 is also applicable to the sliding engagement of the second sliding plate 148 and the base 142, which will not be repeated in addition.

In addition, please refer to FIG. 3 to FIG. 5. In the embodiment, the detachably fixing device 14 further includes a holding structure 152 disposed on the base 142. The holding structure 152 separately holds the circuit board carrying plate 144 at the first position (as shown by FIG. 5). Therein, the holding structure 152 includes a base body 1520, a sliding part 1522, and a spring 1524. The base body 1520 is fixed on the base 142. The sliding part 1522 is restrictedly and slidably disposed on the base body 1520, so as to slide relative to the base 142 in the second direction D2. The spring 1524 is connected to the sliding part 1522 and the base body 1520 to drive the sliding part 1522 to hold the circuit board carrying plate 144. The sliding part 1522 is operable to separate from the circuit board carrying plate 144. In practice, it is practicable for the sliding part 1522 to be restrictedly and slidably disposed on the base 142 (e.g. by bending and extending from the base 142 to form a sliding slot, in which the sliding part 1522 is slidably disposed), the spring 1524 is connected to the sliding part 1522 and the base 142 (e.g. by being disposed in the sliding slot and abutting against the sliding part 1522 and a closed end of the sliding slot). For this case, the base body 1520 can be omitted. For another example, the base 142 forms a through slot (extending in the second direction D2), in which the sliding part 1522 is slidably disposed. The spring 1524 is connected to the base 142 and the sliding part 1522. For this case, the base body 1520 also can be omitted.

Furthermore, in the embodiment, the detachably fixing device 14 further includes a carrying plate restoring part 154 (e.g. but not limited to a spring) connected to the base 142 and the circuit board carrying plate 144 to drive the circuit board carrying plate 144 to move to the second position (as shown by FIG. 3). The sliding part 1522 has a wedge 1522a. The circuit board carrying plate 144 has a stop portion 1449. The sliding part 1522 stops the stop portion 1449 through the wedge 1522a (for preventing the circuit board carrying plate 144 from moving toward the second position) to hold the circuit board carrying plate 144 at the first position (as shown by FIG. 5). The sliding part 1522 is operable to make the wedge 1522a separate from the stop portion 1449 (e.g. a user moves a portion of the sliding part 1522 exposed above the base body 1520 in the section direction D2), so that the circuit board carrying plate 144 is at a state of being able to move (in the first direction D1). At this moment, under the resilience of the carrying plate restoring part 154, the circuit board carrying plate 144 will automatically move away from the first position and toward the second position. This structural feature is convenient for the user to install the detachably fixing device 14 to the casing frame 12 with one hand.

When the user wants to detach the detachably fixing device 14 from the casing frame 12, the user can pull the circuit board carrying plate 144 by hand (e.g. with one hand grasping a manipulation portion 1452 of the circuit board carrying plate 144 and a manipulation portion 1424 of the base 142 to move them closer to each other), so that the circuit board carrying plate 144 leaves the second position and moves towards the first position. When the circuit board carrying plate 144 is about to reach the first position, the circuit board carrying plate 144 (or the stop portion 1449) can abut against a slope of the wedge 1522a to retract the wedge 1522a into the base body 1520, until the circuit board carrying plate 144 reaches the first position and the wedge 1522a passes over the stop portion 1449 to be driven by the spring 1524 to protrude the base body 1520 again to stop the stop portion 1449. At this moment, the first engaging portion 1464 and the second engaging portion 1484 have been separated from the engaging structures 122 and 124. The user now can directly remove the detachably fixing device 14 from the casing frame 12 with one hand. As described above, the detachably fixing device 14 can provide users with convenient installation and removal operations.

Figure 7:
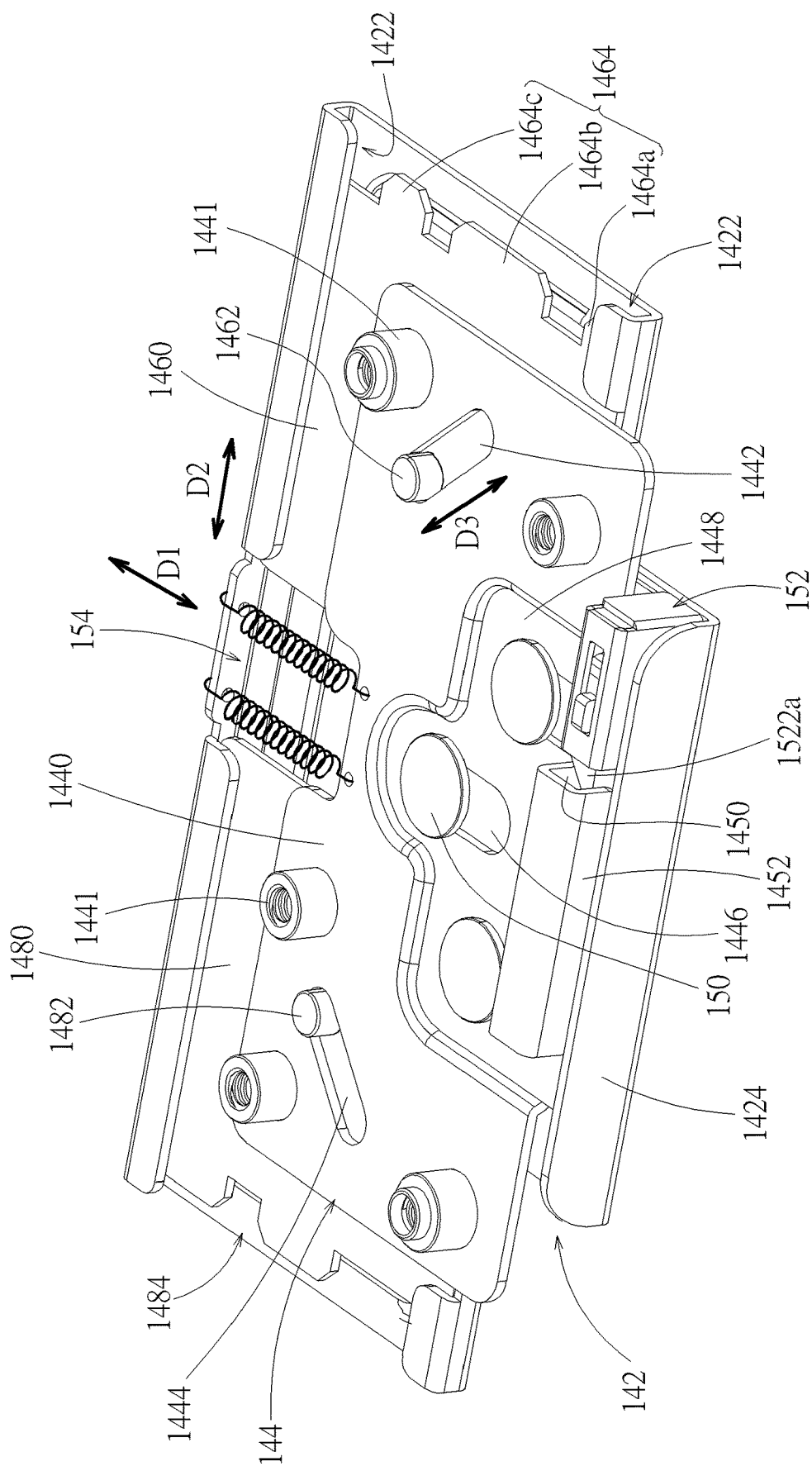
FIG. 7 is a schematic diagram illustrating the circuit board carrying plate of the detachably fixing device in FIG. 1 having a U-shaped section slot.

In the embodiment, the stop portion 1449 is realized by a surface of the manipulation portion 1452 of the circuit board carrying plate 144. The wedge 1522a holds the circuit board carrying plate 144 at the first position by abutting against the surface (as shown by FIG. 5). However, it is not limited thereto in practice. For example, as shown by FIG. 7, the circuit board carrying plate 144 has a U-shaped section slot 1450 (e.g. formed by bending and extending a portion of the plate body 140), extending parallel to the second direction D2. The U-shaped section slot 1450 has the same effect as the stop portion 1449 (i.e. holding the circuit board carrying plate 144 at the first position). Therein, the sliding part 1522 holds the circuit board carrying plate 144 at the first position (as shown by FIG. 7) by fitting the wedge 1522a in the U-shaped section slot 1450 (e.g. through a flat surface of the wedge 1522a abutting against an inner wall of the U-shaped section slot 1450). The sliding part 1522 is operable to separate the wedge 1522a from the U-shaped section slot 1450, so that the circuit board carrying plate 144 is in a state of being able to move (in the first direction D1). At this moment, under the resilience of the carrying plate restoring part 154, the circuit board carrying plate 144 will automatically move away from the first position and toward the second position.

When the circuit board carrying plate 144 is at the second position (referring to FIG. 3), the user can pull the circuit board carrying plate 144 by hand (e.g. with one hand grasping the manipulation portion 1452 of the circuit board carrying plate 144 and the manipulation portion 1424 of the base 142 to move them closer to each other), so that the circuit board carrying plate 144 leaves the second position and moves towards the first position. When the circuit board carrying plate 144 is about to reach the first position, the U-shaped section slot 1450 can abut against the slope of the wedge 1522a to retract the wedge 1522a into the base body 1520, until the circuit board carrying plate 144 reaches the first position and the U-shaped section slot 1450 is aligned with the wedge 1522a so that the wedge 1522a can be driven by the spring 1524 to fit in the U-shaped section slot 1450 again. At this moment, the first engaging portion 1464 and the second engaging portion 1484 have been separated from the engaging structures 122 and 124. The user now can directly remove the detachably fixing device 14 from the casing frame 12 with one hand. As described above, the detachably fixing device 14 can provide users with convenient installation and removal operations. Furthermore, during the above action, when the circuit board carrying plate 144 is not at the first position, the wedge 1522a is not located in the U-shaped section slot 1450.

The holding structure 152 and the carrying plate restoring part 154 provide a positioning mechanism for the circuit board carrying plate 144; however, it is not limited thereto in practice. For example, a ball plunger is disposed on the base 142 and a plurality of positioning holes are correspondingly disposed on the circuit board carrying plate 144, which also can position the circuit board carrying plate 144. In addition, in the embodiment, the engaging structures 122 and 124 are located on a side wall of the electronic apparatus casing 1, so that the detachably fixing device 14 is installed onto the side wall of the electronic apparatus casing 1; however, it is not limited thereto in practice. When the engaging structures 122 and 124 are changed to be disposed on a bottom wall of the electronic apparatus casing 1, the detachably fixing device 14 can be installed onto the bottom wall of the electronic apparatus casing 1.

Figure 8:
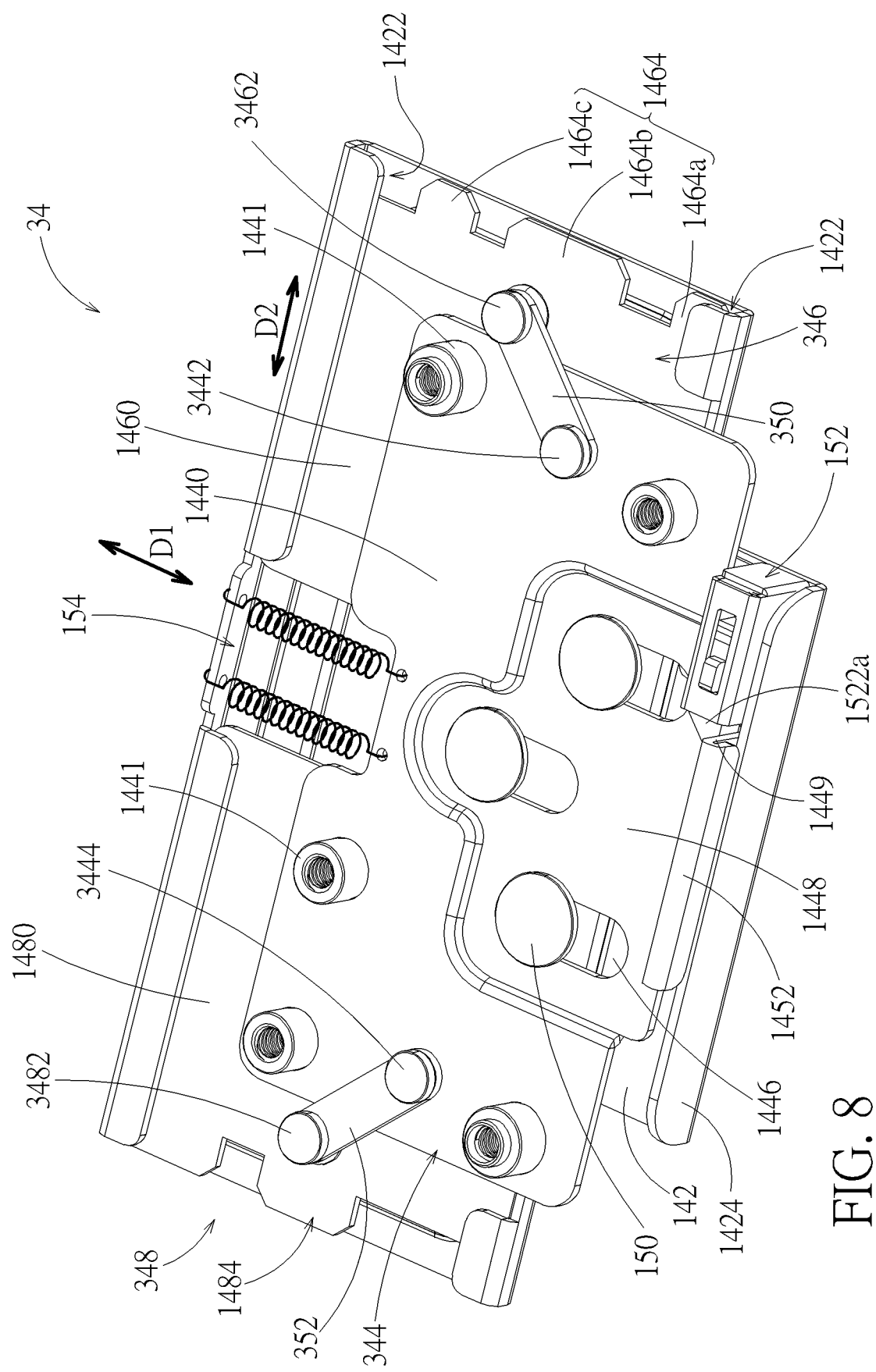
FIG. 8 is a schematic diagram illustrating a detachably fixing device according to another embodiment.
Figure 9:
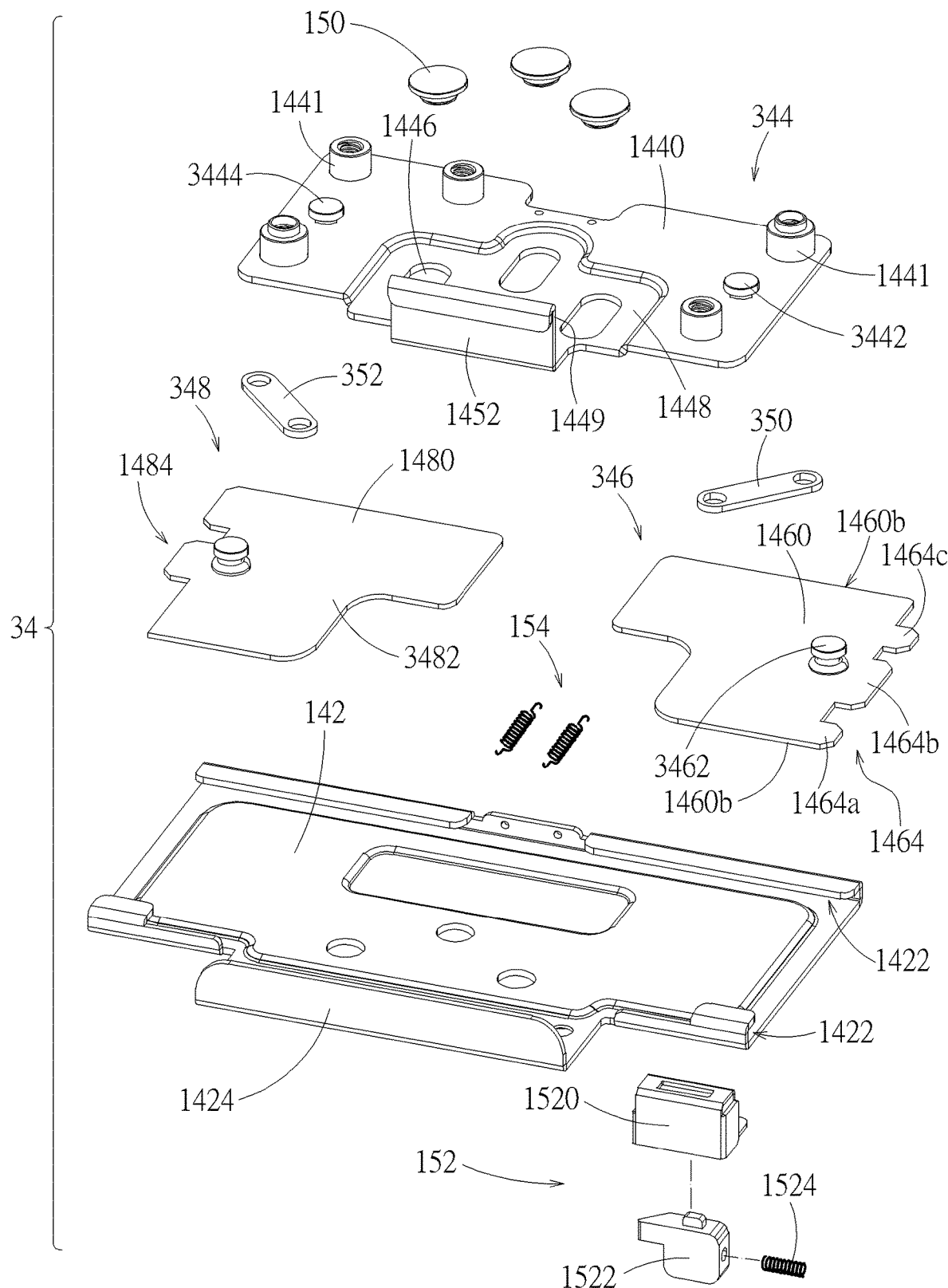
FIG. 9 is an exploded view of the detachably fixing device in FIG. 8.

Furthermore, in the detachably fixing device 14, the linkage mechanism between the first carrying plate linkage portion 1442 and the first sliding plate linkage portion 1462 is realized by the guiding slot and the guiding post; however, it is not limited thereto in practice. Please refer to FIG. 8 and FIG. 9, which show a detachably fixing device 34 according to another embodiment. The detachably fixing device 34 and the detachably fixing device 14 are substantially the same in structure. The detachably fixing device 34 uses the reference numbers of the detachably fixing device 14. For other descriptions about the detachably fixing device 34, please refer to the relevant descriptions of the detachably fixing device 14, which will not be described in addition. In the detachably fixing device 34, the first carrying plate linkage portion 3442 of the circuit board carrying plate 344 and the first sliding plate linkage portion 3462 of the first sliding plate 346 are connected through a linkage part 350. The linkage part 350 is pivotally connected with the first carrying plate linkage portion 3442 and the first sliding plate linkage portion 3462 respectively. Thereby, when moving relative to the base 142 in the first direction D1, the circuit board carrying plate 344 drives the first sliding plate 346 to move relative to the base 142 in the second direction D2. Similarly, the second carrying plate linkage portion 3444 of the circuit board carrying plate 344 and the first sliding plate linkage portion 3482 of the second sliding plate 348 are connected through a linkage part 352. The linkage part 352 is pivotally connected with the second carrying plate linkage portion 3444 and the second sliding plate linkage portion 3482 respectively. Thereby, when moving relative to the base 142 in the first direction D1, the circuit board carrying plate 344 also drives the second sliding plate 348 to move relative to the base 142 in the second direction D2.

Figure 10:
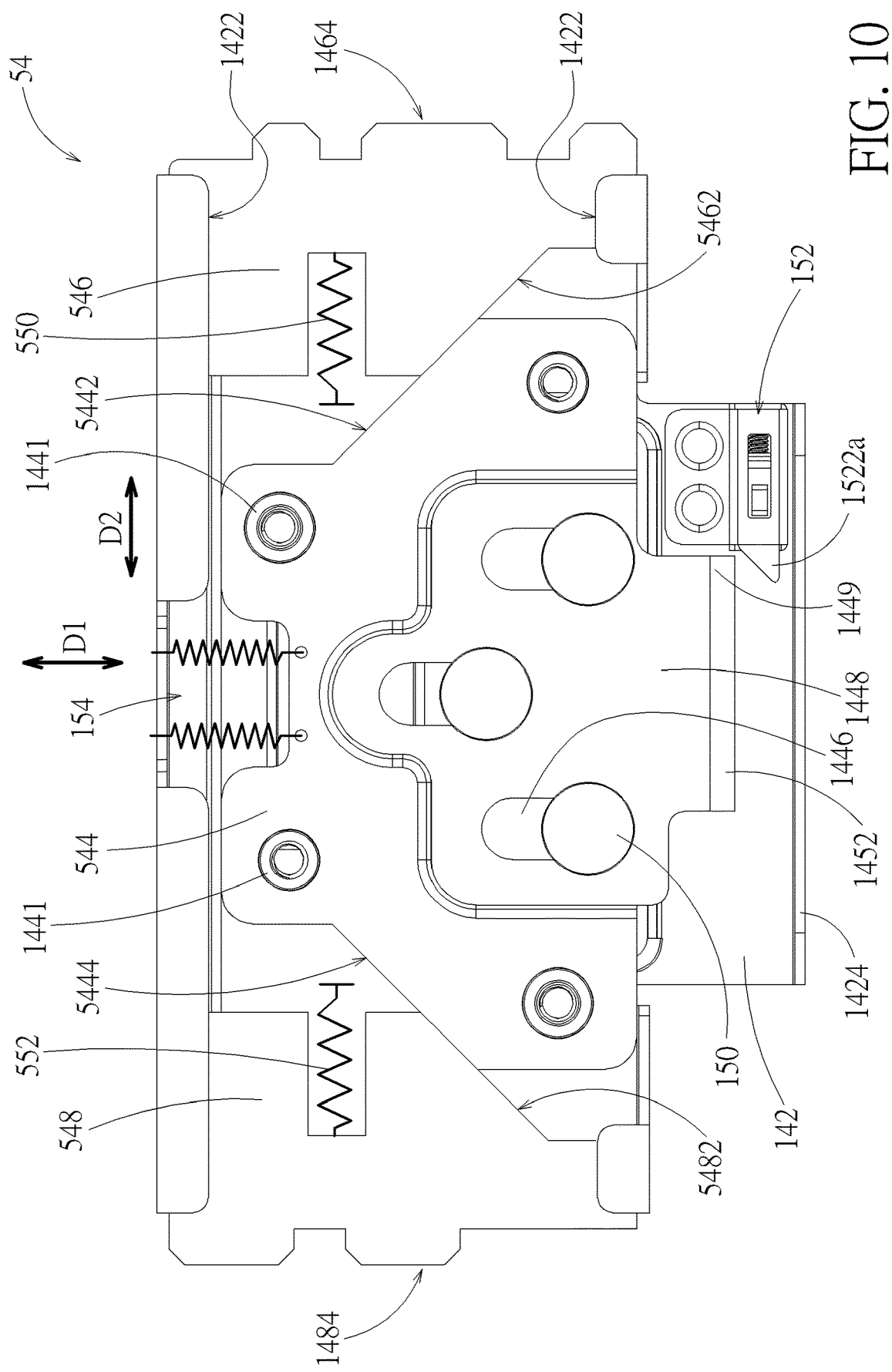
FIG. 10 is a top view of a detachably fixing device according to another embodiment.
Figure 11:
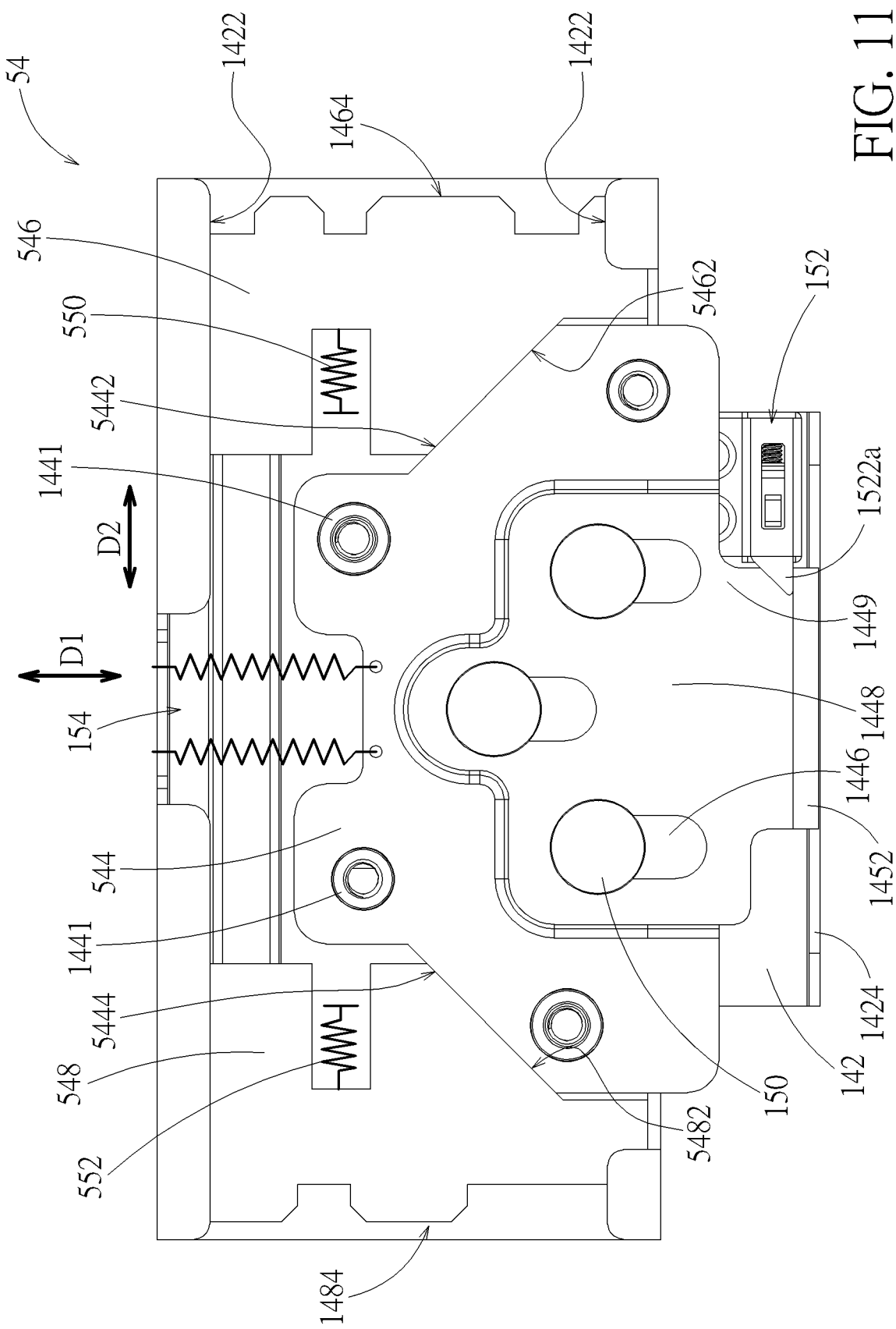
FIG. 11 is a top view of the detachably fixing device in FIG. 10 when a circuit board carrying plate thereof is at a second position.

In addition, in the detachably fixing devices 14 and 34, during the sliding of the circuit board carrying plates 144 and 344 from the first position to the second position, the circuit board carrying plates 144 and 344 drive the first sliding plates 146 and 346 and the second sliding plates 148 and 348 to slide outward; during the sliding of the circuit board carrying plates 144 and 344 from the second position to the first position, the circuit board carrying plates 144 and 344 drives the first sliding plates 146 and 346 and the second sliding plates 148 and 348 to slide inward. However, it is not limited thereto in practice. Please refer to FIG. 10, which shows a detachably fixing device 54 according to another embodiment. The detachably fixing device 54 and the detachably fixing device 14 are substantially the same in structure. The detachably fixing device 54 uses the reference numbers of the detachably fixing device 14. For other descriptions about the detachably fixing device 54, please refer to the relevant descriptions of the detachably fixing device 14, which will not be described in addition. In the detachably fixing device 54, the first carrying plate linkage portion 5442 of the circuit board carrying plate 544 and the first sliding plate linkage portion 5462 of the first sliding plate 546 are oblique edges and abut against each other. The second carrying plate linkage portion 5444 of the circuit board carrying plate 544 and the second sliding plate linkage portion 5482 of the second sliding plate 548 are oblique edges and abut against each other. The detachably fixing device 54 further includes a first sliding plate restoring part 550 and a second sliding plate restoring part 552. The first sliding plate restoring part 550 (e.g. but not limited to a spring) connected to the first sliding plate 546 and the base 142 to drive the first sliding plate 546 to retract back to the base 142. The second sliding plate restoring part 552 (e.g. but not limited to a spring) connected to the second sliding plate 548 and the base 142 to drive the second sliding plate 548 to retract back to the base 142. When sliding from the first position (as shown by FIG. 10) to the second position (as shown by FIG. 11), the circuit board carrying plate 544 pushes against the first sliding plate linkage portion 5462 through the first carrying plate linkage portion 5442 to drive the first sliding plate 546 to slide outward, and pushes the second sliding plate linkage portion 5482 through the second carrying plate linkage portion 5444 to drive the second sliding plate 548 to slide outward. When the circuit board carrying plate 544 slides from the second position (as shown by FIG. 11) to the first position (as shown by FIG. 10), the first carrying plate linkage portion 5442 is no longer forced to push against the first sliding plate linkage portion 5462, and the second carrying plate linkage portion 5444 is no longer forced to push against the second sliding plate linkage portion 5482. However, the first sliding plate 546 and the second sliding plate 548 are affected by the resilience of the first sliding plate restoring part 550 and the second sliding plate restoring part 552 respectively to retract back to the base 142. In addition, in practice, the first sliding plate restoring part 550 can be connected to the first sliding plate 546 and the circuit board carrying plate 544 and also can drive the first sliding plate 546 to retract back to the base 142; the second sliding plate restoring part 552 is also the same, which will not be repeated in addition.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A detachably fixing device, for carrying a circuit board onto a casing frame, the detachably fixing device comprising:
   a base;
   a circuit board carrying plate, slidably disposed on the base in a first direction and having a first carrying plate linkage portion; and
   a first sliding plate, slidably disposed on the base in a second direction, the first direction and the second direction being non-parallel, the first sliding plate having a first sliding plate linkage portion and a first engaging portion, the first sliding plate linkage portion and the first carrying plate linkage portion being mechanically connected with each other, the circuit board carrying plate driving the first sliding plate to slide outward relative to the base to make the first engaging portion protrude from the base in the second direction;
   wherein the circuit board carrying plate is used to carry the circuit board thereon, and the first engaging portion is used to separately engage with an engaging structure of the casing frame.

2. The detachably fixing device according to claim 1, wherein the first direction is perpendicular to the second direction.

3. The detachably fixing device according to claim 1, wherein the first sliding plate is slidably disposed between the base and the circuit board carrying plate.

4. The detachably fixing device according to claim 1, wherein one of the first carrying plate linkage portion and the first sliding plate linkage portion is a guiding slot, the other of the first carrying plate linkage portion and the first sliding plate linkage portion is a guiding post, the guiding post is slidably disposed in the guiding slot, the guiding slot has an extension direction, and the extension direction is non-parallel to the first direction and the second direction.

5. The detachably fixing device according to claim 1, wherein the first carrying plate linkage portion and the first sliding plate linkage portion are connected through a linkage part, the linkage part is pivotally connected with the first carrying plate linkage portion and the first sliding plate linkage portion respectively.

6. The detachably fixing device according to claim 1, further comprising a holding structure, disposed on the base, wherein the holding structure separably holds the circuit board carrying plate at a first position.

7. The detachably fixing device according to claim 6, wherein the holding structure comprises a sliding part and a spring, the sliding part is slidable relative to the base, the spring is connected to the sliding part so as to drive the sliding part to hold the circuit board carrying plate, and the sliding part is operable to separate from the circuit board carrying plate.

8. The detachably fixing device according to claim 7, wherein the sliding part has a wedge, the circuit board carrying plate has a U-shaped section slot extending parallel to the second direction, and the sliding part fits in the U-shaped section slot through the wedge to hold the circuit board carrying plate at the first position.

9. The detachably fixing device according to claim 6, further comprising a carrying plate restoring part, connecting the base and the circuit board carrying plate to drive the circuit board carrying plate to move to a second position.

10. The detachably fixing device according to claim 1, wherein the base has a sliding slot extending parallel to the second direction, and an edge of the first sliding plate slides in the sliding slot.

11. The detachably fixing device according to claim 1, further comprising a second sliding plate, slidably disposed on the base in the second direction, wherein the second sliding plate has a second sliding plate linkage portion and a second engaging portion, the circuit board carrying plate has a second carrying plate linkage portion opposite to the first carrying plate linkage portion, the second sliding plate linkage portion and the second carrying plate linkage portion are mechanically connected with each other, the circuit board carrying plate is operable to slide to make the first sliding plate and the second sliding plate slide outward relative to the base, so that the first engaging portion and the second engaging portion protrude from the base.

12. An electronic apparatus casing, comprising:
   a casing frame, having an engaging structure; and
   a detachably fixing device, for carrying a circuit board, the detachably fixing device as a whole being detachably disposed on the casing frame, the detachably fixing device comprising:
      a base;
      a circuit board carrying plate, slidably disposed on the base in a first direction and having a first carrying plate linkage portion, the circuit board being fixed directly on the circuit board carrying plate; and
      a first sliding plate, slidably disposed on the base in a second direction, the first direction and the second direction being non-parallel, the first sliding plate having a first sliding plate linkage portion and a first engaging portion, the first sliding plate linkage portion and the first carrying plate linkage portion being mechanically connected with each other, the circuit board carrying plate driving the first sliding plate to slide outward relative to the base to make the first engaging portion protrude from the base to separately engage with the engaging structure in the second direction.

13. The electronic apparatus casing according to claim 12, wherein the first engaging portion comprises a plurality of tabs protruding in the second direction, the engaging structure comprises a locking slot, and after the detachably fixing device is installed on the casing frame, at least one of the plurality of tabs fits in the locking slot.

14. The electronic apparatus casing according to claim 12, wherein the first direction is perpendicular to the second direction.

15. The electronic apparatus casing according to claim 12, wherein the first sliding plate is slidably disposed between the base and the circuit board carrying plate.

16. The electronic apparatus casing according to claim 12, wherein one of the first carrying plate linkage portion and the first sliding plate linkage portion is a guiding slot, the other of the first carrying plate linkage portion and the first sliding plate linkage portion is a guiding post, the guiding post is slidably disposed in the guiding slot, the guiding slot has an extension direction, and the extension direction is non-parallel to the first direction and the second direction.

17. The electronic apparatus casing according to claim 12, wherein the first carrying plate linkage portion and the first sliding plate linkage portion are connected through a linkage part, the linkage part is pivotally connected with the first carrying plate linkage portion and the first sliding plate linkage portion respectively.

18. The electronic apparatus casing according to claim 12, wherein the detachably fixing device comprises a holding structure, disposed on the base, the holding structure separably holds the circuit board carrying plate at a first position, the holding structure comprises a sliding part and a spring, the sliding part is slidable relative to the base, the spring is connected to the sliding part so as to drive the sliding part to hold the circuit board carrying plate, and the sliding part is operable to separate from the circuit board carrying plate.

19. The electronic apparatus casing according to claim 18, wherein the detachably fixing device comprises a carrying plate restoring part that connects the base and the circuit board carrying plate to drive the circuit board carrying plate to move to a second position.

20. The electronic apparatus casing according to claim 12, wherein the base has a sliding slot extending parallel to the second direction, and an edge of the first sliding plate slides in the sliding slot.

* * * * *